(12) United States Patent
Kaviani

(10) Patent No.: US 6,788,124 B1
(45) Date of Patent: Sep. 7, 2004

(54) METHOD AND APPARATUS FOR REDUCING JITTER IN A DELAY LINE AND A TRIM UNIT

(75) Inventor: Alireza S. Kaviani, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/285,202

(22) Filed: Oct. 31, 2002

(51) Int. Cl.$^7$ ............................................... H03K 5/13
(52) U.S. Cl. ...................... 327/276; 327/281; 327/261
(58) Field of Search .......................... 327/276, 261, 327/284, 285, 288, 263, 270

(56) References Cited

U.S. PATENT DOCUMENTS

| | | | | |
|---|---|---|---|---|
| 4,805,195 A | * | 2/1989 | Keegan | 375/106 |
| 5,781,056 A | * | 7/1998 | Fujii | 327/276 |
| 6,191,613 B1 | | 2/2001 | Schultz et al. | 326/39 |
| 6,204,710 B1 | | 3/2001 | Goetting et al. | 327/276 |
| 6,289,068 B1 | | 9/2001 | Hassoun et al. | 327/156 |
| 6,384,647 B1 | | 5/2002 | Logue | 327/153 |
| 6,400,734 B1 | | 6/2002 | Weigand | 370/514 |
| 6,459,319 B2 | * | 10/2002 | Sako | 327/276 |

FOREIGN PATENT DOCUMENTS

JP                 04127711 A    *   4/1992

* cited by examiner

*Primary Examiner*—Dinh T. Le
(74) *Attorney, Agent, or Firm*—W. Eric Webostad; Justin Liu

(57) ABSTRACT

A method and apparatus for reducing jitter in a delay line and trim unit is described. The trim unit includes a plurality of delay elements in parallel. At least one of the plurality of delay elements is controllable between on and off states. At least one of the plurality of delay elements includes at least one filter element to filter local supply noise. At least one of the plurality of delay elements includes a plurality of delay circuits having at least one gated delay circuit to control propagation of a clock signal through the plurality of delay circuits. The plurality of delay elements are configured to maintain an overall propagation delay without adding additional circuitry by sizing at least one delay circuit to provide longer propagation delay and sizing the other delay circuits to provide smaller propagation delay. The plurality of delay circuits are sized and arranged to minimize jitter.

27 Claims, 6 Drawing Sheets

METHOD AND APPARATUS FOR REDUCING JITTER IN A DELAY LINE AND A TRIM UNIT

FIELD OF THE INVENTION

One or more aspects of the present invention relate generally to delay lines and more specifically to adjustable delay lines and trim units.

BACKGROUND OF THE INVENTION

Programmable logic devices (PLDs) exist as a well-known type of integrated circuit (IC) that may be programmed by a user to perform specified logic functions. There are different types of programmable logic devices, such as complex programmable logic devices (CPLDs) and field programmable gate arrays (FPGAS). An FPGA typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (bitstream) into internal configuration memory cells that define how the CLBs, IOBs, and interconnect structure are configured. The configuration bitstream may be read from an external memory, conventionally an external integrated circuit memory EEPROM, EPROM, PROM, or the like, though a computer may also be used to provide the bitstream. The collective states of the individual memory cells then determine the function of the FPGA.

Delay lines and trim units are used in integrated circuit (IC) devices such as FPGAs to synchronize clock signals used to clock various circuits therein. For example, delay lines may be used in a wide variety of digital clock management (DCM) circuits to adjust the skew between input and output clock signals.

Delay lines generally provide larger amounts of signal propagation delay with respect to trim units. Delay lines and trim units delay a signal propagating between an input terminal and an output terminal. Fully-digital delay lines are tap-controlled, which typically comprise a large number of delay elements that are commonly referred to as "taps". Taps generally increment in progressively larger delay values to allow a selection between a minimum delay value and a maximum delay value. Tap-controlled delay lines typically have one or more control inputs configured to select a particular tap, i.e., delay element, and therefore a particular propagation delay amount. To provide a lower propagation delay granularity, a trim unit containing additional delay elements may be added in series with a delay line. Propagation delay for individual delay elements may be changed by increasing or decreasing the size and type of its internal delay circuitry. For example, others have increased the amount of propagation delay of a delay element by adding resistors or transistor-based resistors to one or more delay elements. However, adding resistors, transistor-based resistors, and supporting circuitry consumes additional die space, and may increase jitter. Transistor-based resistors make it difficult to tune delay lines and trim units for consistent operation.

One factor contributing to jitter is local supply noise. Parasitic inductive, capacitive, and resistive loads along the supply lines feeding the delay elements can cause voltage fluctuations, including ground bounce, which increases local power supply noise. Supply noise is proportional to the instantaneous current (di/dt) drawn from the power supply. Little attention is given to local noise generated by other running elements in the trim unit and their corresponding support circuitry in the vicinity of the delay elements. Delay elements of a trim unit responsive to an input signal inherently increase supply noise. For example, conventional trim units using parallel delay elements generally receive an input signal to all of the parallel delay elements. Even though only one delay element is used at a time, all of the delay elements are responsive to the input signal. However, the supply noise of each delay element, used or not, adds to the overall supply noise.

Accordingly, it would be both desirable and useful to provide a trim unit to facilitate circuit tuning, and provide a reduction in jitter and power consumption.

SUMMARY OF THE INVENTION

An aspect of the present invention is a trim unit for delaying a clock signal. The trim unit includes a plurality of delay elements. At least one of the plurality of delay elements is controllable between on and off states. The delay elements are controllable such that only one delay element is in the on state at one time. An output circuit having a plurality of inputs and an output is provided. One each of the plurality of inputs is coupled to a respective one of the plurality of delay elements. The output circuit selectively causes an output of a selected one of the plurality of delay elements to drive the output.

An aspect of the present invention is a trim unit configured to delay a clock signal. The trim unit includes a first delay element and a second delay element. A multiplexing circuit having a plurality of inputs and an output is provided. Each of the plurality of inputs is connected to an output of the first delay element and an output of the second delay element. The multiplexing circuit selectively causes the output of a selected one of the first delay element and the second delay element to drive the output. The first delay element and the second delay element are responsive to a control signal such that only one of the first delay element and the second delay element are active at a time. The first delay element and the second delay element include at least one gated delay circuit responsive to the control signal.

An aspect of the present invention is a method for improving jitter in a trim unit. A clock signal is provided to the trim unit. A first delay element and a second delay element are provided in parallel. The first delay element and second delay element are configured to provide different delayed versions of the clock signal. At least one of the first and second delay elements is switchable between on and off states.

An aspect of the present invention is a method for delaying a digital signal. A plurality of delayed versions of the digital signal arranged in parallel having at least a first delay and a second delay are provided. The plurality of delayed versions of the digital signal are provided by a plurality of delay elements. At least one of the delay elements includes a first delay circuit connected to a second delay circuit in series with the first delay circuit. One of the delayed versions of the digital signal is selected. At least one of the delayed versions of the digital signal is switchable between on and off states.

BRIEF DESCRIPTION OF THE DRAWINGS

Accompanying drawing(s) show exemplary embodiment(s) in accordance with one or more aspects of the present invention; however, the accompanying drawing(s) should not be taken to limit the present invention to the embodiment(s) shown, but are for explanation and understanding only.

DETAILED DESCRIPTION OF THE DRAWINGS

One or more aspects of the present invention provide a method and apparatus for reducing jitter in delay lines and trim units, and more particularly in full-digital tap-controlled delay lines and trim units. The present invention may be employed in digital clock manager (DCM) circuits of field programmable gate arrays (FPGAS) to improve clock skew, for example. While aspects of the present invention are described with specific reference to DCM circuits of an FPGA, those skilled in the art will appreciate that the present invention can be used in any digital system employing trim unit circuitry for various applications, including PLDS, SOC, ASSPs, ASICs, DSPS, microprocessors, microcontrollers, and the like.

Figure 1:
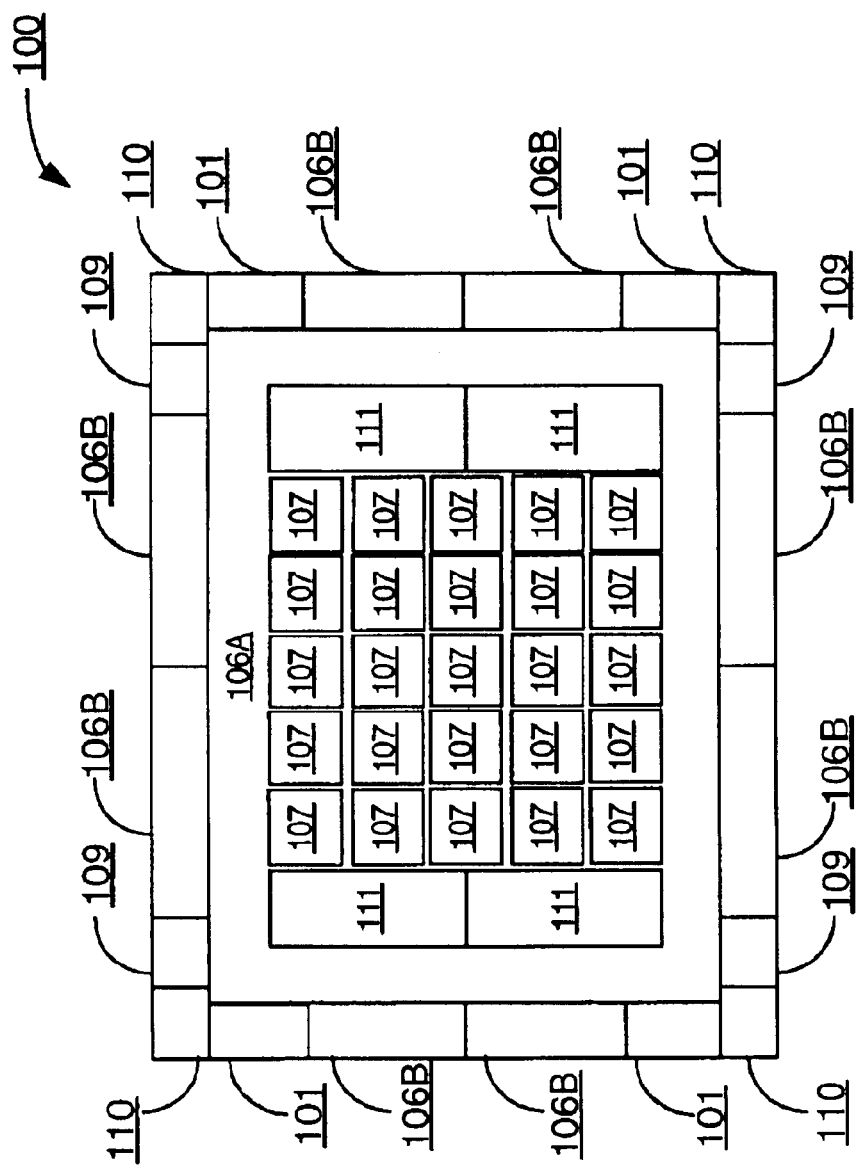
FIG. 1 depicts a high-level block diagram of a field programmable gate array in accordance with one or more aspects of the present invention.

FIG. 1 is a block diagram of an exemplary embodiment of a FPGA 100 in accordance with the present invention. FPGA 100 includes CLBs 107, I/O routing ring 106A, memory, such as random access memory 111, delay lock loops (DLLs) 109, multiply/divide/de-skew clock circuits 110, and programmable input/output blocks (IOBs) 106B. DLLs 109 and clock circuits 110 collectively provide DCMs. FPGA 100 also includes adjustable delay line (ADLs) 101, e.g., tap-controlled delay line, configured to adjust a clock signal input to such FPGA 100 from DLLs 109 and one or more external (off the chip) clock signals. Before clock signals reach various circuits within FPGA 100, such clock signals may be skewed by factors such as capacitive and resistive loading and by propagation delay. For proper operation, clock signals of ADL 101 may be adjusted to compensate for a plurality of clock signal skews. ADL 101 may be configured to adjustably delay one or more clock signals used with other types of integrated circuits and may be an independent integrated circuit.

Figure 2:
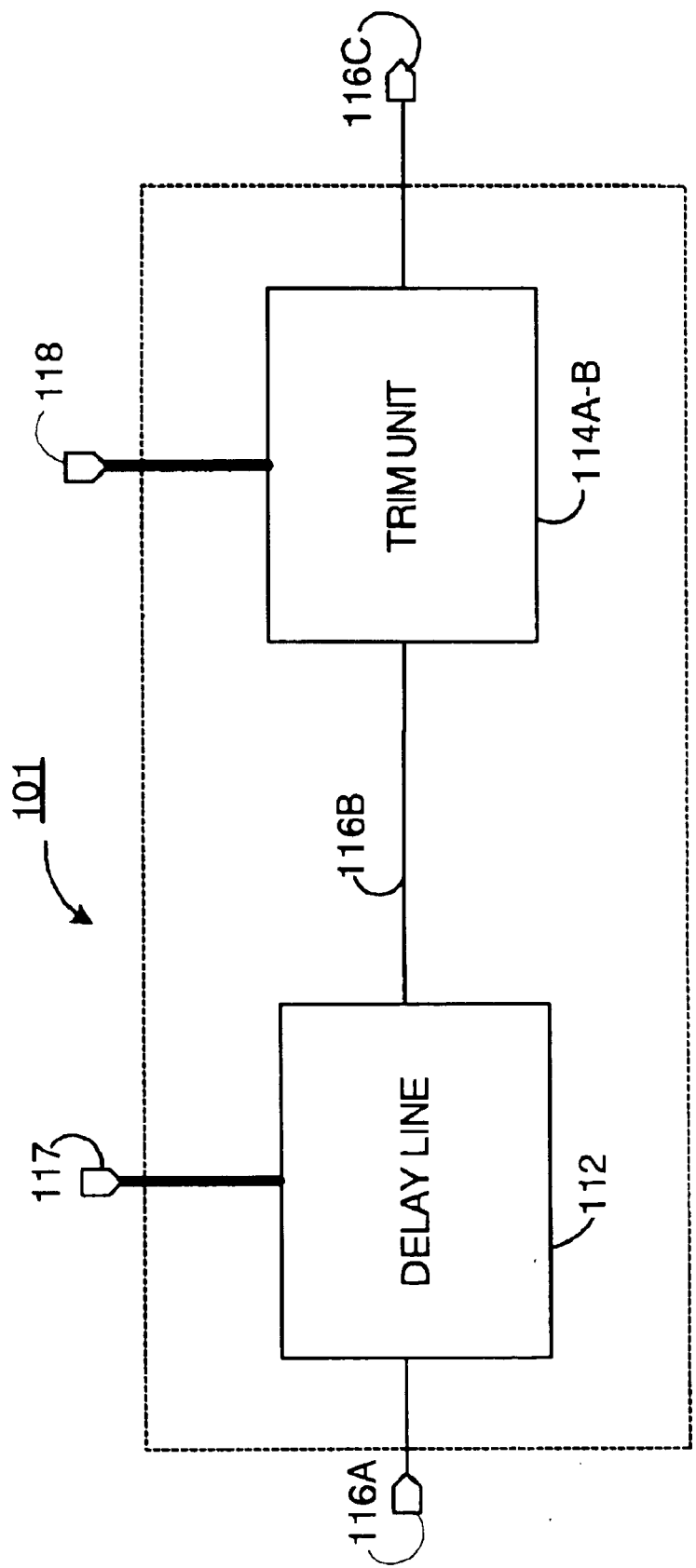
FIG. 2 depicts a high-level block diagram illustrating an exemplary embodiment of a tap-controlled delay line and trim unit in accordance with one or more aspects of the present invention.

FIG. 2 depicts a high-level block diagram illustrating an exemplary embodiment of ADL 101 in accordance with one or more aspects of the present invention. ADL 101 includes delay line 112. Delay line 112 is configured to receive system clock signal 116A and output a delayed version of system clock signal 116A as clock signal 116B. Delay line 112 delays system clock signal 116A a delay amount D in response to delay control signals. Delay control signals are provided to delay line 112 via control bus 117. Delay control signals may be provided from control circuits, such as encoders, or other control circuits, as known. Clock signal 116B is coupled to trim unit (TU) 114A–B. TU 114A–B is configured to receive clock signal 116B and output a delayed version of clock signal 116B as clock signal 116C. TU 114A–B provides delays in a finer granularity than that of delay line 112. TU 114A–B receives delay trim signals via control bus 118 to control trim delay values of clock signal 116B and output clock signal 116C. In this embodiment, ADL 101 is configured to receive system clock signal 116A and output a delayed version of system clock signal 116A as clock signal 116C.

Figure 3:
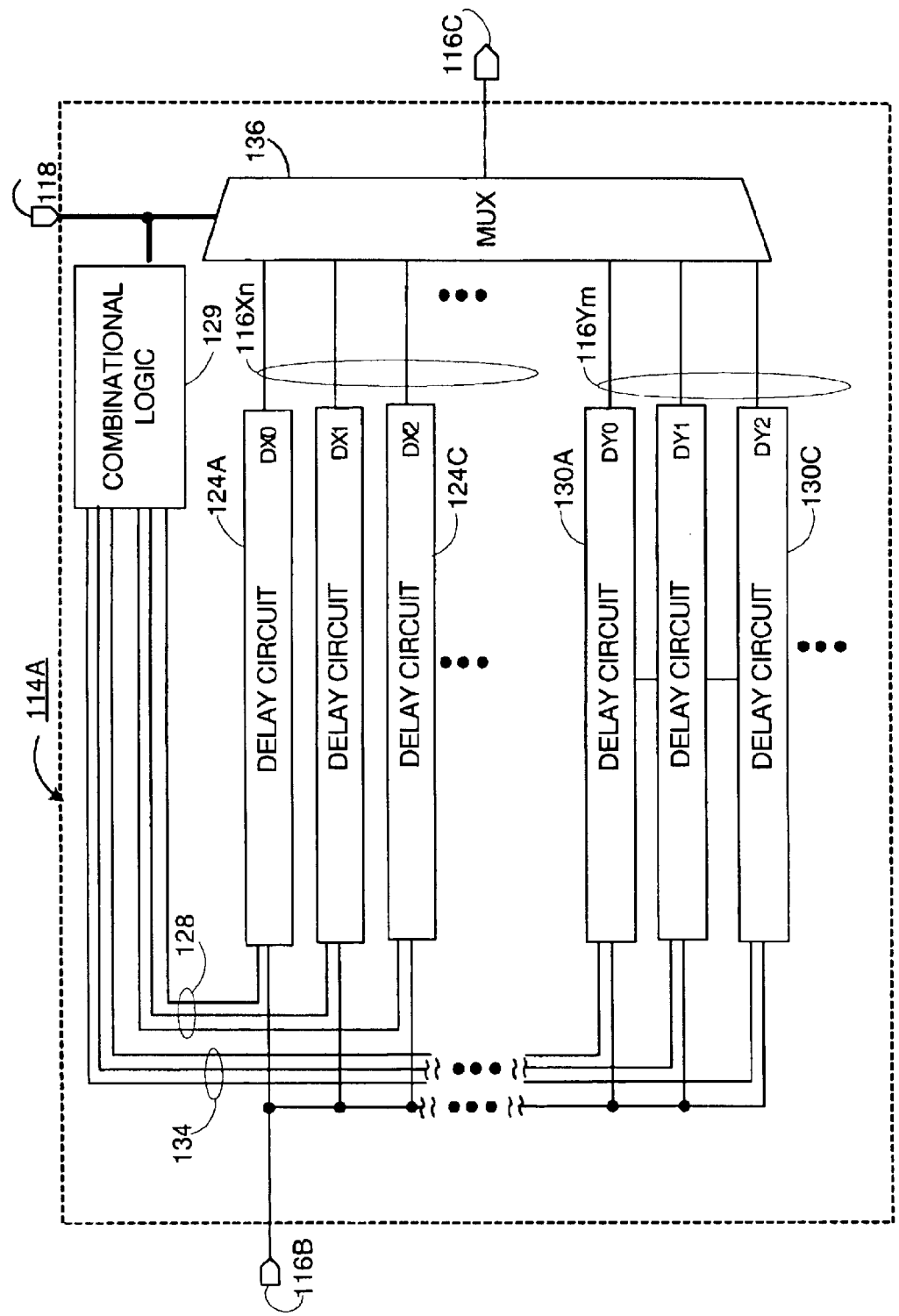
FIGS. 3 and 4 depict trim units of FIG. 2 in accordance with one or more aspects of the present invention.

FIG. 3 depicts a schematic diagram illustrating an exemplary embodiment of TU 114A in accordance with one or more aspects of the present invention. TU 114A receives clock signal 116B and control signals from control bus 118. A plurality of delay circuits 124 and delay circuits 130 (also called taps) receive clock signal 116B. Generally, inputs of delay circuits 124 and delay circuits 130 are electrically connected in parallel. Delay circuits 124 and delay circuits 130 may be interchangeable and may be used to incrementally delay clock signal 116B a plurality of incremental amounts. However, for purposes of clarity, a delay circuit 124 and a delay circuit 130 are described in terms of increasing delay value where delay circuit 124 provides a smaller delay value than delay circuit 130. Delay circuit 124A provides a delay value DXO for clock signal 116B. In general, delay circuit 124n provides a delay DXn where n is an index value representing delay value DX and delay circuit 130m provides a delay DYm where m is an index value representing delay value DY. For example, n=0 indicates base delay (DX0), n=1 represents a delay value (DX1) which is greater than DX0, n=2 represents a delay value (DX2) which is greater than DX1, and so forth. Likewise, m=0 indicates a base delay (DY0), m=1 indicates a delay value (DY1) which is greater than DX0, m=2 indicates a delay value (DY2) which is greater than DX1, and so forth. Delay circuits 124 receive gate enable signal 128 to enable or disable delay circuits 124. Delay circuits 130 receives a gate enable signal 134 to enable or disable delay circuit 130.

TU 114A includes MUX (multiplexer) 136 responsive to control signal 118 to select one of output signals 116Xn and 116Ym from delay circuits 124 and delay circuits 130, respectively. MUX 136 selectively outputs one of output signals 116Xn and 116Ym via clock signal 116C. TU 114 includes combination logic circuit 129 to decode signals from control bus 118 and output control signals 128 and control signals 134 to delay circuits 124 and delay circuits 130, respectively.

Depending on delay control signals provided to MUX 136 via control bus 118, MUX 136 outputs one of delay clock signal 116Xn and delay clock signal 116Ym to clock signal 116C. In this embodiment, one delay value DXn or DYm is used at a time. To reduce power consumption and jitter, gate enable signals 128 and 134 may be used to turn off one or more of delay circuits 124 and delay circuits 130 not used to provide delay value DXn and DYm.

In this embodiment, there are two types of delay circuits (explained in connection with FIGS. 5 and 6), delay circuits 124 and delay circuits 130. Both types of delay circuits receive clock signal 116B and selectively output a delayed version of clock signal 116B as clock signal 116C via MUX 136. When one of delay circuits 124, or 130 is active, at least one other delay circuit 124, 130 is selectively deactivated to reduce jitter and power consumption.

Figure 4:
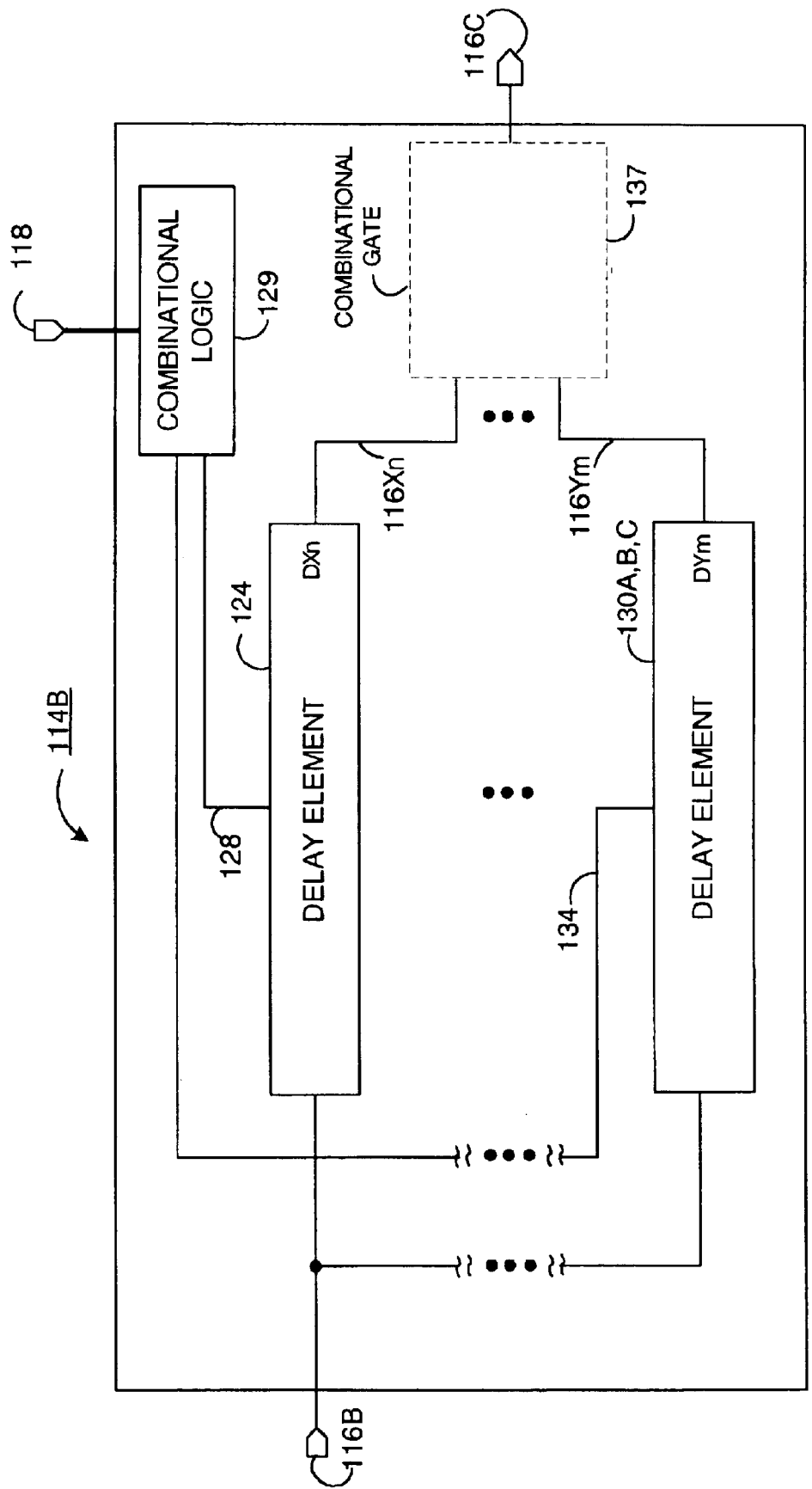

FIG. 4 depicts a high-level schematic diagram illustrating an exemplary embodiment of a TU 114B of FIG. 2. TU 114B is similar to TU 114A as described above, but includes combinational gate 137 in lieu of MUX 136. While in one embodiment, combinational gate 137 is a NAND gate, other equivalent logic circuits may be used. When NAND or AND gates are used for combinational gate 137, the disabled delay elements provide logic 1 output signals. When OR or NOR gates are used, the disabled delay elements provide logic 0 output signals. Combinational gate 137 outputs clock signal 116C responsive to delay clock signal 116Xn or delay clock signal 116Ym. In this embodiment, combination logic circuit 129 selects one of clock signal 116Xn and clock signal 116Ym. Clock signal 116B is output as clock signal 116C via combinational gate 137. Similar to FIG. 3, to reduce power consumption and jitter, gate enable signals 128 and 134 may turn off one or more of delay circuits 124 and delay circuits 130.

Figure 5:
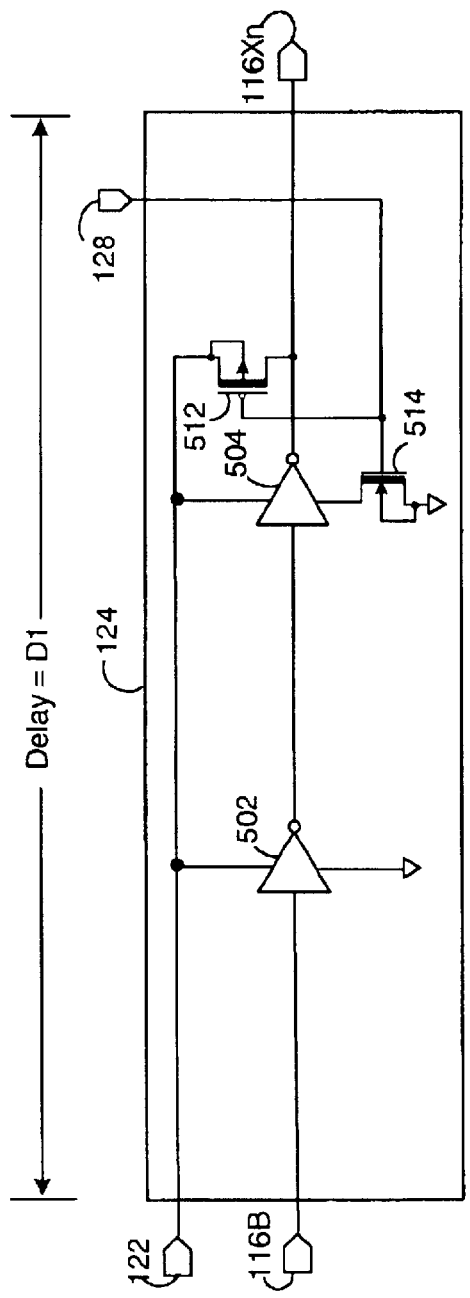
FIGS. 5–8 depict embodiments of delay elements in accordance with one or more aspects of the present invention.

FIG. 5 depicts one embodiment of a delay element 124. For clarity, delay elements 124, and 130 are described in terms of inverters, however, other equivalent circuits such as NAND gates, NOR gates, OR gates, and the like, may be used, as known. Delay element 124 includes two delay circuits, inverters 502 and 504. For clarity, delay circuit 124 illustrates only two inverters 502 and 504, however one or more delay elements, including gated delay elements, may be used. Delay circuit 124 receives supply voltage 122 ("Power supply") and clock signal 116B. Inverters 502 and 504 are arranged in series so that a delay amount for each inverter 502, 504 is additive to provide a total delay D1. Inverters 502 and 504 receive clock signal 116B and output a delayed version of clock signal 116B as clock signal 116Xn. In this embodiment, inverters 502 and 504 are configured as delay elements. More specifically, clock signal 116B is provided to an input of an input delay circuit, namely, inverter 502. An output signal of inverter 502 is provided to an input of end delay circuit, namely, inverter 504. An output of inverter 504 is provided to clock signal 116Xn.

Delay circuit 124 includes PMOS transistor 512 and NMOS transistor 514 to enable and disable inverter 504. Transistors 512 and 514 are arranged such that a source input of PMOS transistor 512 receives supply voltage 122 and the source of NMOS transistor 514 is connected to ground. Gates of each transistor 512 and 514 are responsive to gate enable signal 128. In one embodiment, transistors 512 and 514 are configured such that when gate enable signal 128 is at a logic low, inverter 504 is decoupled from ground via transistor 514 and clock signal 116Xn is pulled up to logic high via transistors 512, thus deactivating delay element 124. This effectively turns off delay element 124, reducing switching noise from inverter 504 and its fan-out circuitry. In another embodiment, inverter 502 is configured to provide a small output drive relative to inverter 504. Inverter 504 requires a larger current drive than inverter 502 for an increased drive capability. Therefore, turning off inverter 504 reduces switching noise caused by delay element 124 and its fan-out circuitry.

Figure 6:
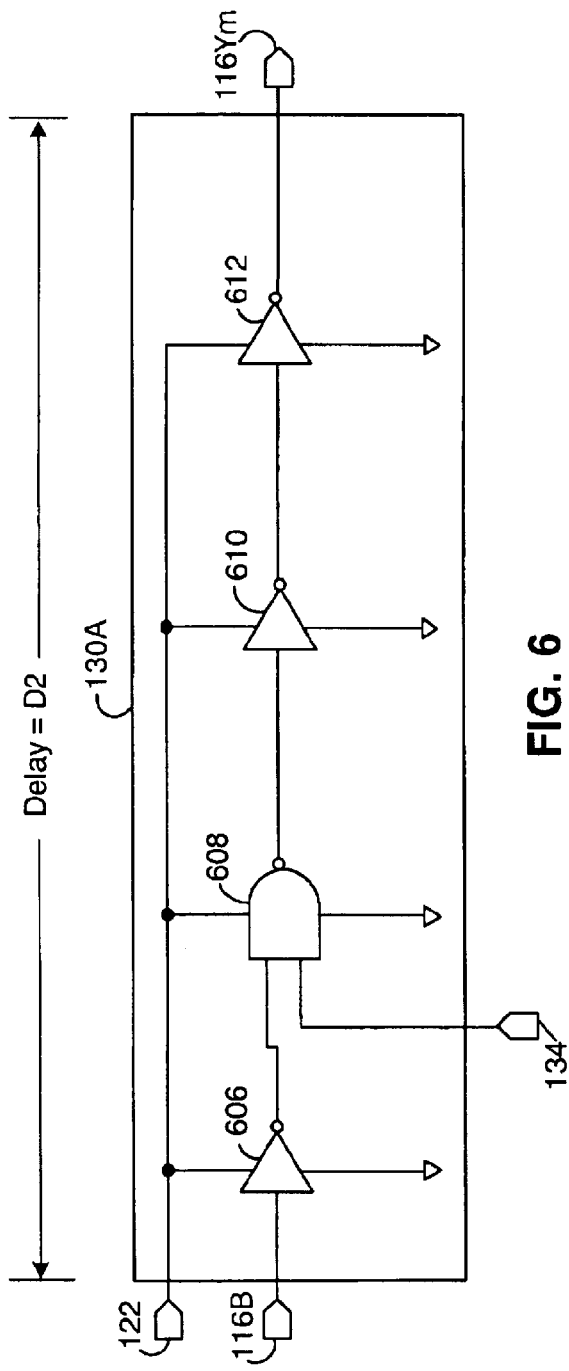

FIG. 6 depicts a schematic diagram illustrating an exemplary embodiment of delay element 130A in accordance with one or more aspects of the present invention. Delay element 130A comprises clock signal 116B and supply voltage 122 coupled to a series of delay circuits, inverters 606, 610–612, and NAND gate 608. Inverters 606, 610–612, and NAND gate 608 are configured as delay circuits, and gated delay circuits, respectively. NAND gate 608 and inverters 606, 610–612 are described collectively as inverting gates 606–612. For purposes of clarity, only four inverting gates 606–612 are shown, however other numbers may be used. Inverting gates 606–612 are configured to receive clock signal 116B and output a delayed version of clock signal 116B as clock signal 116Ym.

More specifically, clock signal 116B is provided to an input of a lead delay circuit, namely, inverter 606. An output signal of inverter 606 is provided to an input of a gated delay circuit, namely, inverting gate 608. Delay enable 134 is provided to another input of inverting gate 608. An output signal of inverting gate 608 is provided to an input of an intermediate delay circuit, namely, inverter 610. An output signal of inverter 610 is provided to an input of an end delay circuit, namely, inverter 612. An output signal of inverter 612 is provided to an input of clock signal 116Ym.

To minimize switching noise, enable signal 134 may be biased to impede propagation of clock signal 116B through inverting gate 608 when delay element 130A is not in use. One or more inverting gates 606–612 may be configured as a gated delay circuit. For example, inverter 606 may be configured as a gated delay circuit similar to inverting gate 608. In one embodiment, more than one inverting gate 606–608 may be gated off to minimize switching noise and power consumption when not in use.

Figure 7:
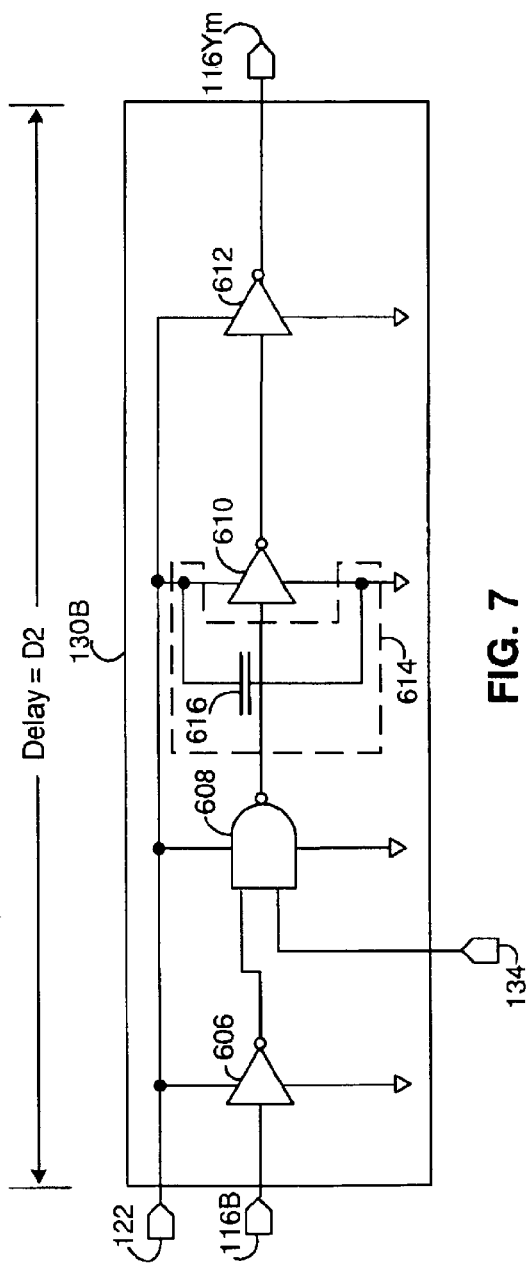

FIG. 7 depicts a schematic diagram illustrating an exemplary embodiment of delay element 130B in accordance with one or more aspects of the present invention. Delay element 130B is similar to delay element 130A described above. However, delay element 130B includes a high frequency filter element 614. High frequency filter element 614 is used to filter supply voltage 122 to minimize local switching noise (di/dt). High frequency filter element 614 may be positioned adjacent to one or more inverting gates 606–612, but is most effective placed adjacent to the gate 606–612 having the largest relative delay value. High frequency filter element 614 may include one or more capacitors 616 coupled between supply 122 and ground. Capacitor or capacitors 616 may be of a plurality of capacitor types such as thin oxide capacitors, metal capacitors, and the like, configured to filter local power supply noise. Similar to delay element 130A, to minimize switching noise, enable signal 134 may be biased to prevent propagation of clock signal 116B through inverting gate 608 when delay element 130B is not in use.

Figure 8:
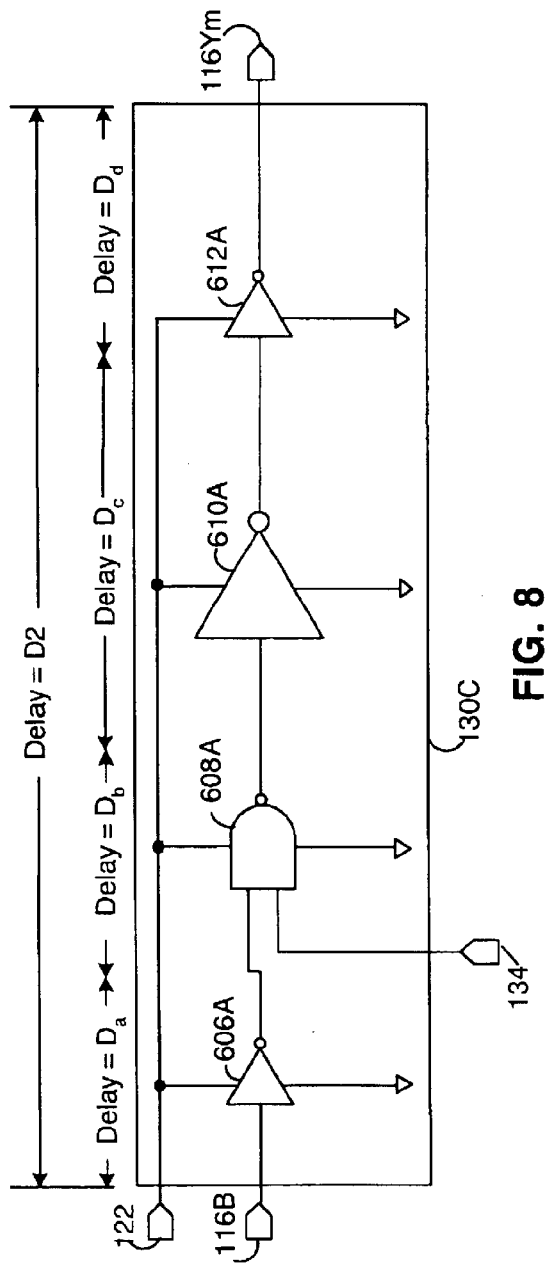

FIG. 8 depicts a schematic diagram illustrating an exemplary embodiment of a delay element 130C in accordance with one or more aspects of the present invention. Delay element 130C is similar to delay elements 130A and 130B as described above. Delay element 130C comprises inverting gates 606A–612A, where one of inverting gates 606A–612A is sized to facilitate retuning and reduce jitter. Inverting gates 606A–612A are sized to provide individual values of $D_{a-d}$, respectively, totaling delay value D2 without utilizing transistor based resistors. To maintain sufficient output drive to circuitry such as MUX 136, and minimize power consumption of delay element 130C, inverter 612A may be sized to provide a larger output drive than inverting gates 606A–610A. In one embodiment, one of inverting gates 606A–612A is optimized in size to reduce jitter and facilitate TU 114A–B tuning. For example, inverter 610A is sized larger than 606A, 608A, and 612A, so that during trim unit tuning, only inverting gate 610A is retuned. Therefore, optimizing one of inverting gates 606A–612A in size, delay loading, and only increasing one inverting gate in delay reduces jitter and facilitates retuning of TU 114A–B. Similar to delay elements 130A and 130B, to minimize switching noise, enable signal 134 may be biased to impede propagation of clock signal 116B through inverting gate 608A when delay element 130B is not in use.

While the foregoing describes exemplary embodiments in accordance with one or more aspects of the present invention, other and further embodiment(s) may be devised without departing from the scope thereof, which is determined by the claims that follow and equivalents thereof. Claims listing steps do not imply any order of the steps.

What is claimed is:

1. A delay trim unit, comprising:

delay elements coupled in parallel, wherein each of the delay elements receives an input signal and is configured to provide an associated delayed signal version of the input signal, a first portion of the delay elements configured to provide a first set of delay indices corresponding to a first portion of delayed signal versions of the input signal, the first portion of the delay elements providing progressively longer delays of a first granularity, a second portion of the delay elements configured to provide a second set of delay indices corresponding to a second portion of delayed signal versions of the input signal, the second portion of the delay elements providing progressively longer delays of a second granularity different from the first granularity;

a decoder coupled to receive control signals and configured to provide first control signaling and second control signaling responsive to decoding the control signals, the first control signaling for masking all but one delay element of the first portion of the delay elements, the second control signaling for masking all but one delay element of the second portion of the delay elements;

the first portion of the delay elements coupled to receive the first control signaling to mask all but the one delay element of the first portion of the delay elements to obtain a delayed indexed version of the input signal;

the second portion of the delay elements coupled to receive the second control signaling to mask all but the one delay element of the second portion of the delay elements to obtain another delayed indexed version of the input signal; and a select circuit coupled to the delay elements to receive the first portion and the second portion of delayed signal versions of the input signal respectively corresponding to the first set of delay indices and the second set of delay indices and configured to provide an output signal responsive to the delayed indexed version of the input signal and the other delay indexed version of the input signal, the output signal having a combined delay of respective delays of the delayed indexed version of the input signal and the other delay indexed version of the input signal.

2. The delay trim unit, according to claim 1, wherein the first granularity is a longer time interval than the second granularity.

3. The delay trim unit, according to claim 2, wherein each delay element of the first portion of delay elements comprises a series of delay circuits at least one of which is a logic gate having at least two inputs, an input of the logic gate for receiving a delayed signal version of the input signal and another input of the logic gate for receiving a control signal of the first control signaling.

4. The delay trim unit, according to claim 3, wherein the control signal is for masking the delayed signal version of the input signal.

5. The delay trim unit, according to claim 4, wherein each delay element of the first portion of the delay elements comprises a high-frequency filter.

6. The delay trim unit, according to claim 5, wherein a delay circuit of the series of delay circuits has transistors sized substantially larger than another delay circuit of the series of delay circuits, the delay circuit for providing a longer delay than the other delay circuit.

7. The delay trim unit, according to claim 6, wherein the high-frequency filter is coupled adjacent to the delay circuit.

8. The delay trim unit, according to claim 1, wherein the select circuit comprises a multiplexer.

9. The delay trim unit, according to claim 2, wherein each delay element of the second portion of delay elements comprises a series of delay circuits, a delay circuit of the series of delay circuits coupled to a first transistor and a second transistor, gates of the first transistor and the second transistor being commonly coupled to receive a control signal of the second control signaling.

10. The delay trim unit, according to claim 9, wherein output of the delay circuit is selectively coupled to a supply voltage via the first transistor responsive to the control signal.

11. The delay trim unit, according to claim 10, wherein the delay circuit is selectively coupled to a ground via the second transistor responsive to the control signal.

12. The delay trim unit, according to claim 1, wherein the input signal is an output of a delay line.

13. The delay trim unit, according to claim 12, wherein the delay line in combination with the delay trim unit provide an adjustable delay line.

14. The delay trim unit, according to claim 13, wherein the adjustable delay line is a part of a programmable logic device.

15. A delay trim unit, comprising:

delay elements coupled in parallel, wherein each of the delay elements receives an input signal and is configured to provide an associated delayed signal version of the input signal, a first portion of the delay elements configured to provide a first set of delay indices corresponding to a first portion of delayed signal versions of the input signal, the first portion of the delay elements providing progressively longer delays of a first granularity, a second portion of the delay elements configured to provide a second set of delay indices corresponding to a second portion of delayed signal versions of the input signal, the second portion of the delay elements providing progressively longer delays of a second granularity, the second granularity different from the first granularity; and a select circuit coupled to the delay elements to receive the first portion and the second portion of delayed signal versions of the input signal respectively corresponding to the first set of delay indices and the second set of delay indices and configured to provide an output signal responsive to a delayed indexed version of the input signal selected from the first portion of the delay elements and another delay indexed version of the input signal selected from the second portion of the delay elements, the output signal having a combined delay of respective delays of the delayed indexed version of the input signal and the other delay indexed version of the input signal, wherein delay spacing between the first set of delay indices is a longer time interval than delay spacing between the second set of delay indices.

16. The delay trim unit, according to claim 15, wherein each delay element of the first portion of delay elements comprises a series of delay circuits at least one of which is a logic gate having at least two inputs, an input of the logic gate for receiving a delayed signal version of the input signal and another input of the logic gate for receiving a control signal.

17. The delay trim unit, according to claim 16, wherein the control signal for each said delay element of the first portion of delay elements collectively are for masking all but one of the first portion of delayed signal versions of the input signal.

18. The delay trim unit, according to claim 17, wherein each delay element of the first portion of the delay elements comprises a high-frequency filter.

19. The delay trim unit, according to claim 18, wherein a delay circuit of the series of delay circuits has transistors sized substantially larger than another delay circuit of the series of delay circuits, the delay circuit for providing a longer delay than the other delay circuit.

20. The delay trim unit, according to claim 19, wherein the high-frequency filter is coupled adjacent to the delay circuit.

21. The delay trim unit, according to claim 15, wherein the select circuit comprises a multiplexer.

22. The delay trim unit, according to claim 15, wherein each delay element of the second portion of delay elements comprises a series of delay circuits, a delay circuit of the series of delay circuits coupled to a first transistor and a second transistor, gates of the first transistor and the second transistor being commonly coupled to receive a control signal.

23. The delay trim unit, according to claim 22, wherein output of the delay circuit is selectively coupled to a supply voltage via the first transistor responsive to the control signal.

24. The delay trim unit, according to claim 23, wherein the delay circuit is selectively coupled to a ground via the second transistor responsive to the control signal.

25. The delay trim unit, according to claim 15, wherein the input signal is an output of a delay line.

26. The delay trim unit, according to claim 25, wherein the delay line in combination with the delay trim unit provide an adjustable delay line.

27. The delay trim unit, according to claim 26, wherein the adjustable delay line is part of a programmable logic device.

* * * * *